United States Patent
Cao et al.

(10) Patent No.: US 10,141,352 B2
(45) Date of Patent: Nov. 27, 2018

(54) MANUFACTURING METHOD OF ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Zhanfeng Cao, Beijing (CN); Feng Zhang, Beijing (CN); Bin Zhang, Beijing (CN); Xiaolong He, Beijing (CN); Zhengliang Li, Beijing (CN); Wei Zhang, Beijing (CN); Feng Guan, Beijing (CN); Jincheng Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/325,402

(22) PCT Filed: Mar. 9, 2016

(86) PCT No.: PCT/CN2016/075984
§ 371 (c)(1),
(2) Date: Jan. 10, 2017

(87) PCT Pub. No.: WO2017/049885
PCT Pub. Date: Mar. 30, 2017

(65) Prior Publication Data
US 2017/0294461 A1 Oct. 12, 2017

(30) Foreign Application Priority Data
Sep. 23, 2015 (CN) .......................... 2015 1 0614230

(51) Int. Cl.
*H01L 27/12* (2006.01)
*H01L 21/77* (2017.01)

(52) U.S. Cl.
CPC .......... *H01L 27/1262* (2013.01); *H01L 21/77* (2013.01); *H01L 27/12* (2013.01); *H01L 27/124* (2013.01)

(58) Field of Classification Search
None
See application file for complete search history.

(56) References Cited

U.S. PATENT DOCUMENTS

| | | | | |
|---|---|---|---|---|
| 2003/0073267 | A1* | 4/2003 | Baek | ................. G02F 1/136286 438/151 |
| 2008/0143903 | A1* | 6/2008 | Ahn | ................. G02F 1/136286 349/38 |

(Continued)

FOREIGN PATENT DOCUMENTS

| | | |
|---|---|---|
| CN | 1702530 A | 11/2005 |
| CN | 1945855 A | 4/2007 |

(Continued)

OTHER PUBLICATIONS

CN PCT International Search Report and Written Opinion, Application No. PCT/CN2016/075984, dated Jun. 29, 2016, 12 pps.

(Continued)

*Primary Examiner* — Daniel Whalen
(74) *Attorney, Agent, or Firm* — Armstrong Teasdale LLP

(57) ABSTRACT

A manufacturing method of an array substrate is provided. The method includes sequentially depositing a first electrode layer and a gate metal layer on a base substrate, the first electrode layer including at least two conductive layers, formation materials of the at least two conductive layers having different etching rates. The method also includes forming a photoresist layer on the gate metal layer, exposing and developing the photoresist layer using a halftone mask plate, performing a first etching process on the gate metal layer, etching the first electrode layer, and ashing the photoresist layer, performing a second etching process on the (Continued)

gate metal layer by using remaining photoresist layer as a mask, stripping the remaining photoresist layer, and sequentially forming a semiconductor layer, a source and drain electrode layer, a via-hole and a second electrode layer on the gate metal layer on which the second etching process has been performed.

8 Claims, 4 Drawing Sheets

(56) References Cited

U.S. PATENT DOCUMENTS

2012/0138938 A1 6/2012 Bae et al.
2012/0298984 A1* 11/2012 Park .................. H01L 27/1225
257/43

FOREIGN PATENT DOCUMENTS

| CN | 102270604 A | 12/2011 |
| CN | 102881695 A | 1/2013 |
| CN | 104733500 A | 6/2015 |
| CN | 105280552 A | 1/2016 |

OTHER PUBLICATIONS

English Translation of CN PCT Written Opinion, Application No. PCT/CN2016/075984, dated Jun. 29, 2016, 5 pps.
China First Office Action, Application No. 201510614230.1, dated Sep. 25, 2017, 17 pps.: with English translation.
China Second Office Action, Application No. 201510614230.1, dated May 9, 2018, 14 pps.: with English translation.

* cited by examiner

MANUFACTURING METHOD OF ARRAY SUBSTRATE, ARRAY SUBSTRATE AND DISPLAY DEVICE

CROSS-REFERENCE TO RELATED APPLICATIONS

This application is a National Stage entry of PCT/CN2016/075984 filed Mar. 9, 2016, which claims the benefit and priority of Chinese Patent Application No. 201510614230.1, filed Sep. 23, 2015, both which are hereby incorporated by reference in their entirety.

BACKGROUND

Embodiments of the disclosure relate to a manufacturing method of an array substrate, an array substrate, and a display device.

Thin film transistor liquid crystal displays (abbreviated as TFT-LCDs) have characteristics such as small size, low power consumption, no radiation, and so forth, and have been dominating the current flat-panel display market. By virtue of Advanced Super Dimension Switch (abbreviated as ADS), an edge electric field is generated by inter-pixel electrodes in a same plane, such that rotation transformation in a plane direction (in parallel to the substrate) occurs to all the oriented liquid crystal molecules between and directly above the electrodes. ADS enlarges a viewing angle and improves light transmissivity of a liquid crystal layer. Moreover, with the development of the science and technology, display devices trend to be efficient, green and energy-saving.

In order to simplify the process in the prior art, a first electrode mask and a gate mask are generally formed with halftone mask plates to reduce the number of mask plates. FIGS. 1a-1d schematically illustrate, through structural sectional views, a process of a manufacturing method for an array substrate in the prior art. The manufacturing method includes the steps of sequentially depositing a first electrode layer 02 and a gate layer 03 on a base substrate 01, and coating a photoresist on the gate layer 03 to form a photoresist layer 04, exposing and developing the photoresist layer 04 using a halftone mask plate to form a structure as shown in FIG. 1a, etching the first electrode layer 02 and the gate layer 03 to form a structure as shown in FIG. 1b, ashing the photoresist layer 04 to form a structure as shown in FIG. 1c, wherein the first electrode in a bar shape formed at this time has a slight size difference in width from the corresponding gate, and a width of the first electrode is slightly smaller than that of the corresponding gate, then performing a second etching process on the gate layer 03 so that a width of the gate is reduced to form a structure as shown in FIG. 1d, wherein at this time, a width W1 of the first electrode is larger than a width W2 of the corresponding gate. That is, a distance L1 between two adjacent first electrodes is smaller than a distance L2 between two adjacent gates, which is disadvantageous to the increase of an aperture ratio of a display panel.

BRIEF DESCRIPTION

The embodiments of the disclosure provide a manufacturing method of an array substrate, an array substrate, and a display device, which can increase an etching speed of a first electrode layer in the array substrate, reduce a size difference in width between the first electrode and corresponding gate, and increase an aperture ratio of the display device.

A first aspect of the embodiments of the disclosure provides a manufacturing method of an array substrate. The method includes sequentially depositing a first electrode layer and a gate metal layer on a base substrate wherein the first electrode layer includes at least two conductive layers and formation materials of the at least two conductive layers having different etching rates, forming a photoresist layer on the gate metal layer, exposing and developing the photoresist layer using a halftone mask plate, performing a first etching process on the gate metal layer, etching the first electrode layer, and ashing the photoresist layer, performing a second etching process on the gate metal layer by using remaining photoresist layer as a mask, stripping the remaining photoresist layer, and sequentially forming a semiconductor layer, a source and drain electrode layer, a via-hole and a second electrode layer on the gate metal layer on which the second etching process has been performed.

In the manufacturing method of an array substrate provided in the first aspect of the embodiments of the disclosure, when the first electrode layer and the gate metal layer are etched, as the first electrode layer includes at least two conductive layers and the formation materials of the two conductive layers have different etching rates, the conductive layer having a higher etching rate will be etched faster within a same period during the initial period of time of the etching process. Thus, within a certain period of time, there will be a difference in width between the conductive layer having a higher etching rate and the conductive layer having a lower etching rate. This difference can enlarge the contact area of the etching solution with the conductive layer having a lower etching rate, thereby increasing an etching speed of the conductive layer having a lower etching rate and increasing a difference in width between the first electrode and the gate. After a second etching process is performed on the gate metal layer, the difference in width between the first electrode and the gate is reduced, such that a difference in width between the first electrode and a corresponding gate is within a designed allowable range. That is, an error between an actual width and a preset width of the first electrode is reduced, a distance between two adjacent first electrodes is enlarged, and thereby an aperture ratio of the display device is increased.

According to an exemplary embodiment of the disclosure, a first electrode layer includes a first conductive layer and a second conductive layer, and the step of sequentially depositing a the first electrode layer and a gate metal layer on a base substrate includes depositing the first conductive layer on the base substrate, depositing the second conductive layer on the first conductive layer wherein an etching rate of the second conductive layer is higher than that of the first conductive layer, and depositing the gate metal layer on the second conductive layer.

In this exemplary embodiment of the disclosure, when being etched, the second conductive layer, as the upper layer, is etched more during a same period of time. The etching solution may contact an upper surface of the first conductive layer as a result of the difference in width between the first conductive layer and the second conductive layer, so as to increase a speed at which the first conductive layer is etched, thereby increasing the difference in width between the etched first electrode layer and the gate metal layer.

According to an exemplary embodiment of the disclosure, a first electrode layer includes a first conductive layer and a second conductive layer, and the step of sequentially depositing a the first electrode layer and a gate metal layer on a base substrate includes depositing the second conductive layer on the base substrate wherein an etching rate of the second conductive layer is higher than that of the first conductive layer, depositing the first conductive layer on the second conductive layer, and depositing the gate metal layer on the first conductive layer.

In this exemplary embodiment of the disclosure, when being etched, the second conductive layer, as the lower layer, is etched more during a same period of time. The etching solution may contact a lower surface of the first conductive layer as a result of a difference in width between the first conductive layer and the second conductive layer, so as to increase a speed at which the first conductive layer is etched, thereby increasing the difference in width between the etched first electrode layer and the gate metal layer.

According to an exemplary embodiment of the disclosure, the etching the first electrode layer includes etching each conductive layer of the first electrode layer through a same etching process. This can reduce processing steps.

According to an exemplary embodiment of the disclosure, the etching the first electrode layer includes etching each conductive layer of the first electrode layer through a separate etching process.

According to an exemplary embodiment of the disclosure, material of the first conductive layer is indium tin oxide (ITO) or silver (Ag). Further, the material of the first conductive layer may be amorphous indium tin oxide (a-ITO) or polycrystalline indium tin oxide (p-ITO). Etching rates of these materials are relatively low.

According to an exemplary embodiment of the disclosure, material of the second conductive layer is indium gallium zinc oxide (IGZO), indium zinc oxide (IZO), zinc nitride oxide (ZnNO), or indium tin zinc oxide (ITZO). Etching rates of these materials are relatively high.

A second aspect of the embodiments of the disclosure provides an array substrate manufactured by any manufacturing method of an array substrate described above. The array substrate provided in the second aspect of the embodiments of the disclosure can increase the aperture ratio of a display device.

A third aspect of the embodiments of the disclosure provides a display device that includes the array substrate described above. The display device provided in the third aspect of the embodiments of the disclosure has a desired display effect.

BRIEF DESCRIPTION OF THE DRAWINGS

For the sake of illustrating the technical solutions of the embodiments of the disclosure more clearly, a brief introduction to drawings of the embodiments is made as follows. Apparently, the following drawings described below merely relate to some embodiments of the disclosure, but do not limit the disclosure.

DETAILED DESCRIPTION

Figure 1A:
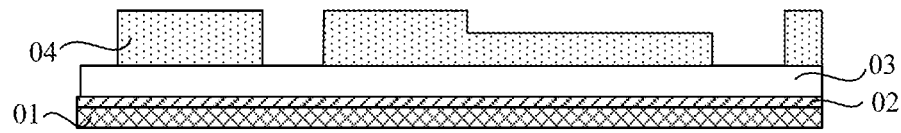
FIGS. 1a-1d schematically illustrate, through structural sectional views, a process of a manufacturing method of an array substrate in the prior art.
Figure 1B:
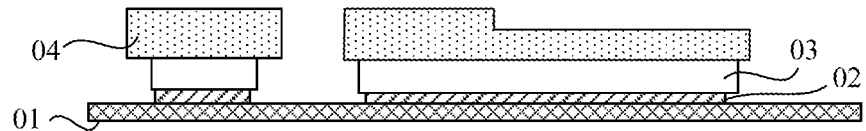
Figure 1C:
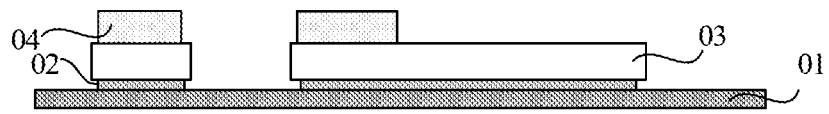
Figure 1D:
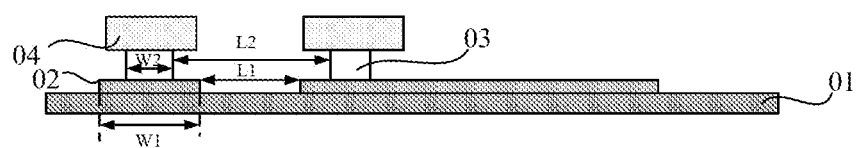

The technical solutions of the embodiments of the present disclosure will be described clearly and thoroughly hereinafter in conjunction with the drawings in respective embodiments in order to make the objects, technical solutions, and advantages of the embodiments of the disclosure more clear. Obviously, the embodiments described are only some rather than all of the embodiments of the disclosure. All other embodiments obtained by one ordinary person skilled in the art based on the described embodiments in the disclosure without creative work are within the scope of the present disclosure.

In the description of the present disclosure, it should be noted that the oriental or positional relationship indicated by the terms "upper", "lower", "top", "bottom" or the like is the oriental or positional relationship shown in the drawings, and such terms are used only for the purpose of description and simplifying the description rather than indicating or suggesting that the device or element indicated must be in a specific orientation, be structured and operated in a specific orientation. Such terms shall not be deemed to limit the scope of the present disclosure.

In addition, in the description of the disclosure, the expression "multiple" or "a plurality of" means two or more unless otherwise specified.

Figure 2:
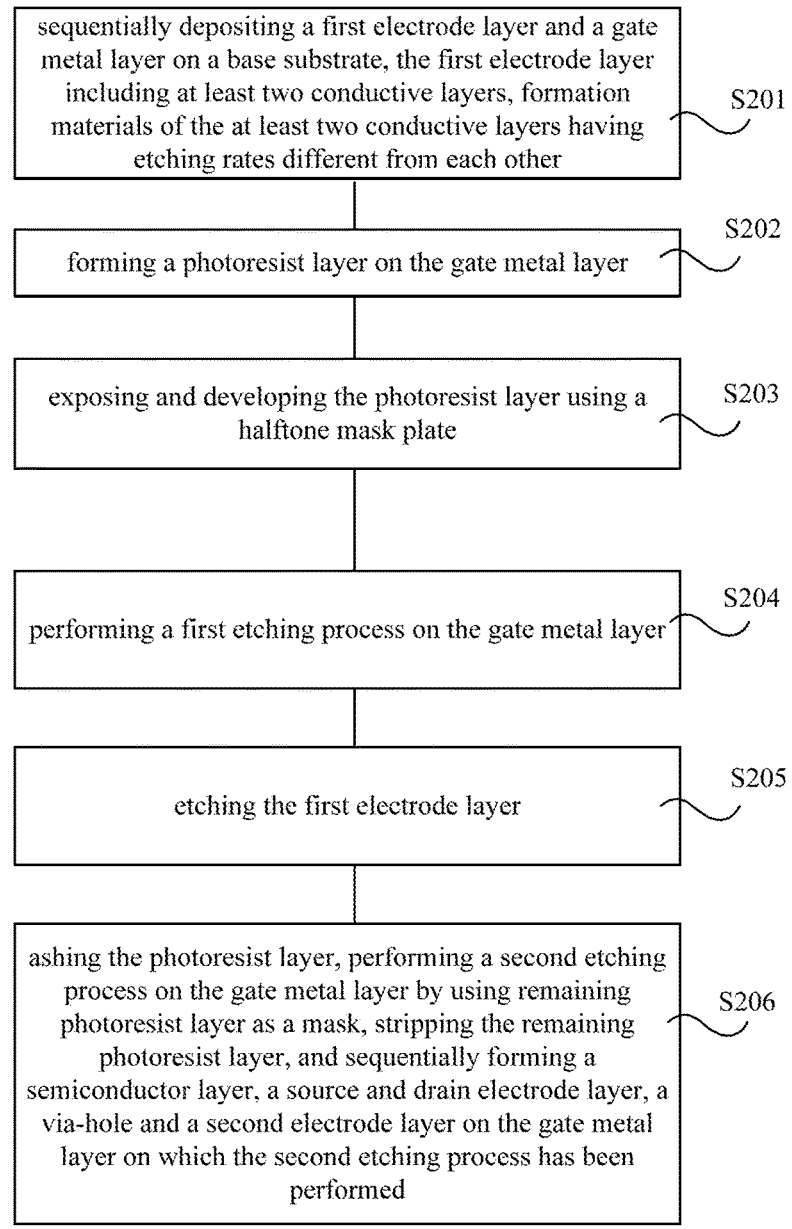
FIG. 2 is a flowchart of the manufacturing method of an array substrate provided in a first aspect of the embodiments of the disclosure.
Figure 3A:
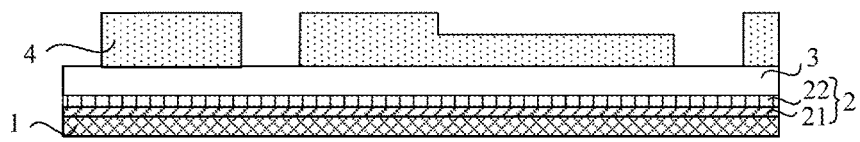
FIGS. 3a-3e schematically illustrate, through structural sectional views, a process of the manufacturing method of an array substrate provided in the first aspect of the embodiments of the disclosure.
Figure 3B:
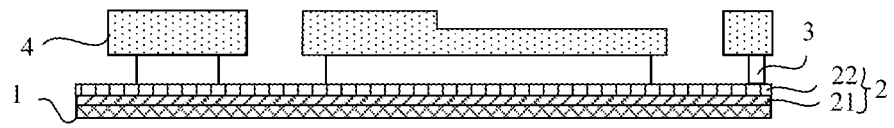
Figure 3C:
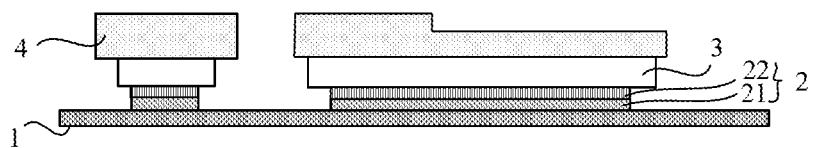
Figure 3D:
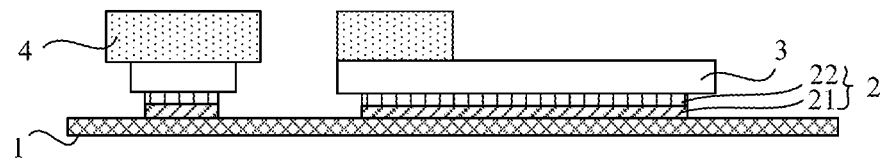
Figure 3E:
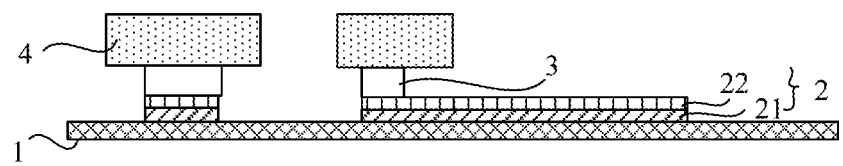

FIGS. 2 and 3a-3e are referred to firstly. FIG. 2 is a flowchart of a manufacturing method of an array substrate provided in a first aspect of the embodiments of the disclosure. FIGS. 3a-3e schematically illustrate, through structural sectional views, a process of the manufacturing method of an array substrate provided in the first aspect of the embodiments of the disclosure.

A first aspect of the embodiments of the disclosure provides a manufacturing method of an array substrate including the following steps:

Step S201: sequentially depositing a first electrode layer 2 and a gate metal layer 3 on a base substrate 1, the first electrode layer 2 including at least two conductive layers, formation materials of the at least two conductive layers having different etching rates;

Step S202: forming a photoresist layer 4 on the gate metal layer 3;

Step S203: exposing and developing the photoresist layer 4 using a halftone mask plate;

Step S204: performing a first etching process on the gate metal layer 3;

Step S205: etching the first electrode layer 2;

Step S206: ashing the photoresist layer 4, performing a second etching process on the gate metal layer 3 by using remaining photoresist layer as a mask, stripping the remaining photoresist layer, and sequentially forming a semiconductor layer, a source and drain electrode layer, a via-hole and a second electrode layer on the gate metal layer 3 on which the second etching process has been performed.

In the manufacturing method of an array substrate provided in the first aspect of the embodiments of the disclosure, when the first electrode layer 2 and the gate metal layer 3 are etched, as the first electrode layer 2 includes at least two conductive layers and the formation materials of the two conductive layers have different etching rates, the conductive layer having a higher etching rate will be etched faster within a same period during the initial period of time of the etching process. Thus, within a certain period of time, there will be a difference in width between the conductive layer having a higher etching rate and the conductive layer having a lower etching rate. This difference can enlarge the contact area of the etching solution with the conductive layer having a lower etching rate, thereby increasing an etching speed of the conductive layer having a lower etching rate and increasing a difference in width between the first electrode and the gate. After a second etching process is performed on the gate metal layer 3, the difference in width between the first electrode and the gate is reduced, such that a difference in width between the first electrode and a corresponding gate is within a designed allowable range. That is, an error between an actual width and a preset width of the first electrode is reduced, a distance between two adjacent first electrodes is enlarged, and thereby an aperture ratio of the display device is increased.

The etching rate here is a ratio of a thickness difference before and after the etching process to the etching time, and is an indicator for etching speed. The aforesaid first electrode layer 2 will turn into a first electrode after being exposed, developed, and etched. The gate metal layer 3 will turn into a gate after being exposed, developed, and etched, and the source and drain electrode layer will turn into a source electrode layer and a drain electrode layer after being exposed, developed, and etched.

Though in FIGS. 3a-3e, description is made by taking the first electrode layer 2 of a two-layer structure as an example, the first electrode layer 2 is not limited to a two-layer structure, and it may be a three or more-layer structure. In the three or more-layer structure, an etching rate of at least one conductive layer is different from those of other conductive layers, or each conductive layer of the three or more-layer structure has a different etching rate.

In an exemplary embodiment, the first electrode layer 2 may include a first conductive layer 21 and a second conductive layer 22, and the sequentially depositing the first electrode layer 2 and the gate metal layer 3 on the base substrate 1 specifically includes depositing the first conductive layer 21 on the base substrate 1, depositing the second conductive layer 22 on the first conductive layer 21 wherein an etching rate of the second conductive layer 22 is higher than that of the first conductive layer 21, and depositing the gate metal layer 3 on the second conductive layer 22.

In this exemplary embodiment of the disclosure, when being etched, the second conductive layer 22, as the upper layer, is etched more during a same period of time. The etching solution may contact an upper surface of the first conductive layer 21 as a result of a difference in width between the first conductive layer 21 and the second conductive layer 22, so as to increase a speed at which the first conductive layer 21 is etched, thereby increasing the difference in width between the etched first electrode layer and the gate metal layer 3.

According to another exemplary embodiment of the disclosure, the first electrode layer 2 may include a first conductive layer 21 and a second conductive layer 22, and the step of sequentially depositing the first electrode layer 2 and the gate metal layer 3 on the base substrate 1 specifically includes depositing the second conductive layer 22 on the base substrate 1 wherein an etching rate of the second conductive layer 22 is higher than that of the first conductive layer 21, depositing the first conductive layer 21 on the second conductive layer 22, and depositing the gate metal layer 3 on the first conductive layer 21.

In this exemplary embodiment of the disclosure, when being etched, the second conductive layer 22, as the lower layer, is etched more during a same period of time. The etching solution may contact a lower surface of the first conductive layer 21 as a result of a difference in width between the first conductive layer 21 and the second conductive layer 22, so as to increase a speed at which the first conductive layer 21 is etched, thereby increasing the difference in width between the etched first electrode layer and the gate metal layer 3.

That is, the conductive layer having a higher etching rate may be the topmost layer or the bottommost layer of the multi-layer conductive layer of the first electrode layer.

According to an exemplary embodiment of the disclosure, the Step S205, etching the first electrode layer 2, may specifically include etching each conductive layer of the first electrode layer through a same etching process. This can reduce processing steps.

Figure 4:
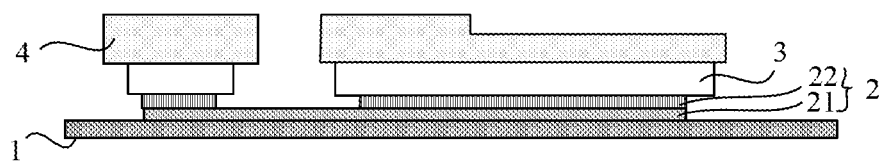
FIG. 4 illustrates, through a structural sectional view, a process of preparing a first electrode in the manufacturing method of an array substrate provided in the first aspect of the embodiments of the disclosure.

According to an exemplary embodiment of the disclosure, the Step S205, etching the first electrode layer 2, may specifically include etching each conductive layer of the first electrode layers through a separate etching process. That is, as shown in FIG. 4, an upper conductive layer of the first electrode layer 2 is first etched to form a structure shown in FIG. 4, and then a lower conductive layer of the first electrode layer 2 is etched to form a structure shown in FIG. 3c.

According to an exemplary embodiment of the disclosure, material of the first conductive layer 21 may be amorphous indium tin oxide (a-ITO), polycrystalline indium tin oxide (p-ITO), indium tin oxide (ITO) or silver (Ag). Etching rates of these materials are relatively low.

According to an exemplary embodiment of the disclosure, material of the second conductive layer 22 may be indium gallium zinc oxide (IGZO), indium zinc oxide (IZO), zinc nitride oxide (ZnNO), or indium tin zinc oxide (ITZO). Etching rates of these materials are relatively high.

A second aspect of the embodiments of the disclosure provides an array substrate manufactured by any manufacturing method of an array substrate described above. The array substrate provided in the second aspect of the embodiments of the disclosure can increase the aperture ratio of a display device.

A third aspect of the embodiments of the disclosure provides a display device that includes the array substrate described above. The display device provided in the third aspect of the embodiments of the disclosure has a desired display effect.

The display device may be any product or component having a display function, such as a display screen of a laptop, electronic paper, an organic light emitting diode display, a liquid crystal display, a liquid crystal TV, a digital photo frame, a cellphone, a tablet computer, and the like.

The aforesaid embodiments are only exemplary embodiments of the disclosure, and do not intend to limit the scope of the disclosure. The scope of the disclosure is determined by the appended claims.

What is claimed is:
1. A manufacturing method of an array substrate, comprising:
sequentially depositing a first electrode layer and a gate metal layer on a base substrate, the first electrode layer including at least two conductive layers, formation materials of the at least two conductive layers having different etching rates;

forming a photoresist layer on the gate metal layer;
exposing and developing the photoresist layer using a halftone mask plate;
performing a first etching process on the gate metal layer;
etching the first electrode layer;
ashing the developed photoresist layer; and
performing a second etching process only on the gate metal layer by using remaining photoresist layer as a mask, and stripping the remaining photoresist layer.

2. The manufacturing method of the array substrate according to claim 1, wherein the first electrode layer includes a first conductive layer and a second conductive layer, and the sequentially depositing the first electrode layer and the gate metal layer on the base substrate comprises:
depositing the first conductive layer on the base substrate;
depositing the second conductive layer on the first conductive layer, an etching rate of the second conductive layer being higher than that of the first conductive layer; and
depositing the gate metal layer on the second conductive layer.

3. The manufacturing method of the array substrate according to claim 1, wherein the first electrode layer includes a first conductive layer and a second conductive layer, and the sequentially depositing the first electrode layer and the gate metal layer on the base substrate comprises:
depositing the second conductive layer on the base substrate, an etching rate of the second conductive layer being higher than that of the first conductive layer;
depositing the first conductive layer on the second conductive layer; and
depositing the gate metal layer on the first conductive layer.

4. The manufacturing method of the array substrate according to claim 1, wherein the etching the first electrode layer comprises:
etching each conductive layer of the first electrode layer through a same etching process.

5. The manufacturing method of the array substrate according to claim 1, wherein the etching the first electrode layer comprises:
etching each conductive layer of the first electrode layer through a separate etching process.

6. The manufacturing method of the array substrate according to claim 1, wherein material of the first conductive layer is indium tin oxide (ITO) or silver (Ag).

7. The manufacturing method of the array substrate according to claim 1, wherein material of the first conductive layer is amorphous indium tin oxide (a-IT0) or polycrystalline indium tin oxide (p-ITO).

8. The manufacturing method of the array substrate according to claim 6, wherein material of the second conductive layer is indium gallium zinc oxide (IGZO), indium zinc oxide (IZO), zinc nitride oxide (ZnNO), or indium tin zinc oxide (ITZO).

* * * * *

UNITED STATES PATENT AND TRADEMARK OFFICE
CERTIFICATE OF CORRECTION

PATENT NO. : 10,141,352 B2
APPLICATION NO. : 15/325402
DATED : November 27, 2018
INVENTOR(S) : Zhanfeng Cao et al.

It is certified that error appears in the above-identified patent and that said Letters Patent is hereby corrected as shown below:

In the Claims

In Claim 7, Column 8, Line 20, delete "oxide (a-IT0)" and insert therefor -- oxide (a-ITO) --.

Signed and Sealed this
Twenty-sixth Day of February, 2019

Andrei Iancu
*Director of the United States Patent and Trademark Office*